United States Patent
Kida

(10) Patent No.: US 8,899,726 B2
(45) Date of Patent: Dec. 2, 2014

(54) LIQUID DROPLET EJECTING HEAD AND IMAGE FORMING APPARATUS

(71) Applicant: Hitoshi Kida, Kanagawa (JP)

(72) Inventor: Hitoshi Kida, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/941,811

(22) Filed: Jul. 15, 2013

(65) Prior Publication Data
US 2014/0022305 A1 Jan. 23, 2014

(30) Foreign Application Priority Data

Jul. 20, 2012 (JP) ................................ 2012-162023

(51) Int. Cl.
*B41J 2/14* (2006.01)
*B41J 2/16* (2006.01)

(52) U.S. Cl.
CPC .......... *B41J 2/14314* (2013.01); *B41J 2/14072* (2013.01)
USPC ............................................ 347/50; 347/58

(58) Field of Classification Search
CPC .............. B41J 2/14314; B41J 2/14024; B41J 2/14072; B41J 2002/14491; B41J 2/17523
USPC .............................. 347/50, 56–59, 68, 70, 71
See application file for complete search history.

(56) References Cited

U.S. PATENT DOCUMENTS

| 5,652,608 | A | * | 7/1997 | Watanabe et al. | 347/50 |
| 8,162,444 | B2 | * | 4/2012 | Miura et al. | 347/58 |
| 2012/0069095 | A1 | | 3/2012 | Kida et al. | |
| 2012/0212547 | A1 | | 8/2012 | Takemoto et al. | |
| 2012/0229542 | A1 | | 9/2012 | Kida | |

FOREIGN PATENT DOCUMENTS

JP 2005-254616 9/2005

* cited by examiner

*Primary Examiner* — Juanita D Jackson

(74) *Attorney, Agent, or Firm* — Oblon, Spivak, McClelland, Maier & Neustadt, L.L.P.

(57) ABSTRACT

A liquid droplet ejecting head is disclosed. The liquid droplet ejecting head includes an electromechanical transducer element; a first substrate which includes a first wiring member; a reinforcing member which is mounted on the first substrate; and a second substrate which includes a second wiring member and which is mounted on the reinforcing member, wherein liquid droplets are ejected when driving power is supplied to the electromechanical transducer element via the first wiring member and the second wiring member.

12 Claims, 8 Drawing Sheets

LIQUID DROPLET EJECTING HEAD AND IMAGE FORMING APPARATUS

TECHNICAL FIELD

The present invention relates to liquid droplet ejecting heads which include electromechanical transducer elements, and image forming apparatuses having mounted thereto the liquid droplet ejecting heads.

BACKGROUND ART

A related-art liquid droplet ejecting head is known, which includes a nozzle; an ink chamber; an ink supply path; an electromechanical transducer element; a drive IC which selects the electromechanical transducer element for supplying a drive voltage, etc., wherein a first wiring member which is electrically connected to the drive IC is arranged on a first substrate.

In such a liquid droplet ejecting head, a method is adopted, wherein, for example, a second substrate on which a second wiring member is arranged is provided in order to supply a signal from a host apparatus to the first wiring member and the second substrate is directly pasted onto the first substrate such that the first wiring member and the second wiring member overlap. Moreover, a method of joining the first wiring member and the second wiring member with a solder or a method of joining them with wire bonding may be adopted.

When electrically connecting the first wiring member and the second wiring member, it is preferable to connect a second substrate 50 such as an FPC, etc., to an end portion of a first substrate 20 from points of view of construction method and wiring design. Moreover, in order to reinforce the strength of a first substrate, it is preferable to provide a reinforcing member on the first substrate.

However, when the second substrate 50 is connected to the end portion of the first substrate 20, it is necessary to arrange the reinforcing member, avoiding a connecting portion between the first substrate 20 and the second substrate 50, causing the end portion of the first substrate 20 to have no reinforcing member present. Therefore, there is a problem that the strength of a connecting portion between the first substrate 20 and the second substrate 50 decreases. In other words, there is a problem that the strength of the first substrate may not be secured sufficiently.

Moreover, when the second substrate is directly pasted onto the first substrate, a step occurs between a face on the first substrate and a face on the second substrate, so that it is difficult to join and fix the reinforcing member from over the second substrate. Therefore, there is a problem that it is necessary to provide a large opening in the reinforcing member as a space for connecting the second wiring member and an opening space which is separate from the reinforcing member becomes necessary, causing the size of the first substrate to increase to raise the cost.

PATENT DOCUMENT

Patent Document 1 JP2005-254616A

DISCLOSURE OF THE INVENTION

In light of matters as described above, an object of the present invention is to provide a liquid droplet ejecting head which can secure a sufficient strength of a first substrate and which can avoid an increased size of the first substrate.

According to an embodiment of the present invention, a liquid droplet ejecting head is provided, including an electromechanical transducer element; a first substrate which includes a first wiring member; a reinforcing member which is mounted on the first substrate; and a second substrate which includes a second wiring member and which is mounted on the reinforcing member, wherein liquid droplets are ejected when driving power is supplied to the electromechanical transducer element via the first wiring member and the second wiring member.

Embodiments of the present invention make it possible to provide a liquid droplet ejecting head which can secure a sufficient strength of the first substrate and which can avoid an increased size of the first substrate.

BRIEF DESCRIPTION OF THE DRAWINGS

Other objects, features, and advantages of the present invention will become more apparent from the following detailed descriptions when read in conjunction with the accompanying drawings, in which.

BEST MODE FOR CARRYING OUT THE INVENTION

Below, embodiments for carrying out the present invention are described with reference to the drawings. In the respective drawings, the same letters are applied to the same elements, so that duplicate explanations may be omitted.

Figure 1:
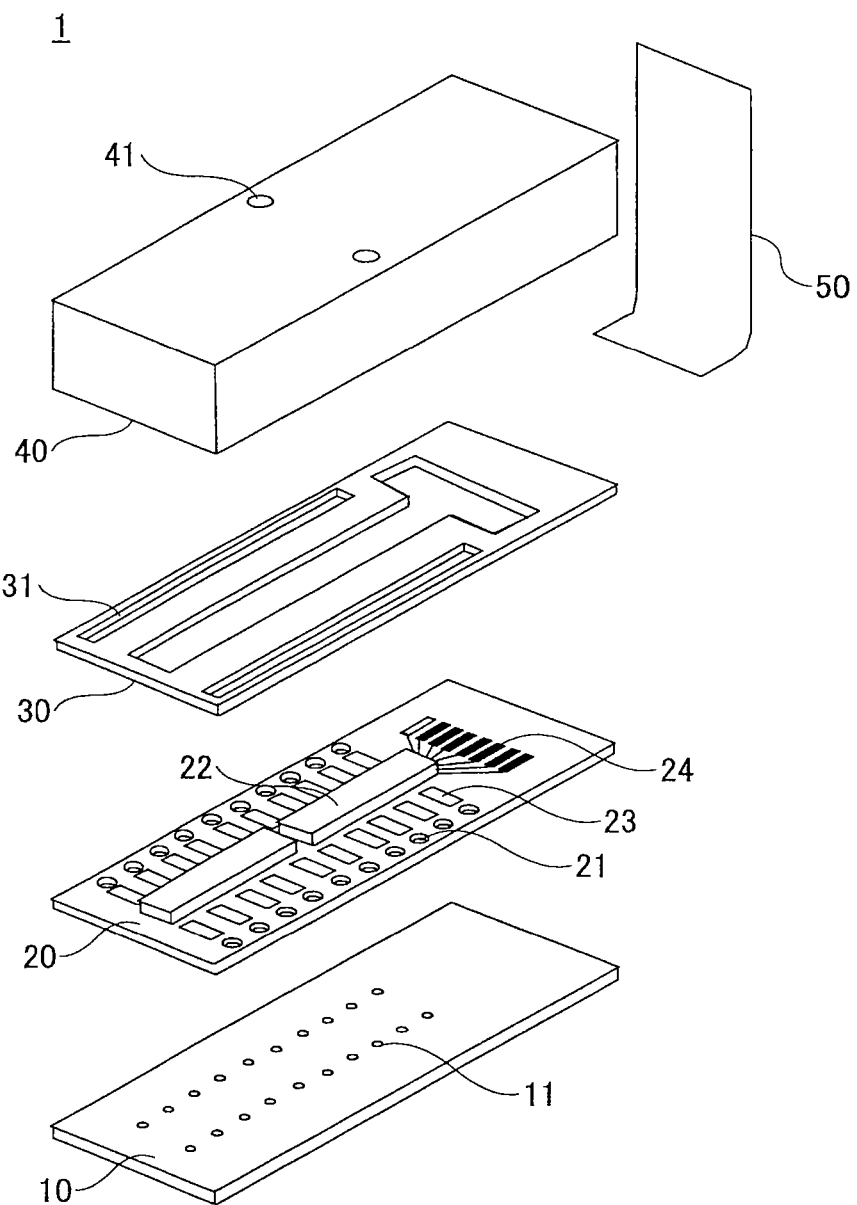
FIG. 1 is an exploded perspective view exemplifying a liquid droplet ejecting head according to a first embodiment.

FIG. 1 is an exploded perspective view exemplifying a liquid droplet ejecting head according to a first embodiment. With reference to FIG. 1, the liquid droplet ejecting head 1 generally includes a nozzle substrate 10; a first substrate 20; a reinforcing member 30; a frame member 40; and a second substrate 50.

The nozzle substrate 10, which is a plate-shaped member, has formed therein nozzle holes 11 which eject liquid droplets (ink droplets). As materials for the nozzle substrate 10, stainless steel, nickel, silicon, etc., may be used, for example. A thickness of the nozzle substrate 10 may be set to be about 40 μm, for example.

The first substrate 20, which is arranged on the nozzle substrate 10, is composed of a material with a small thickness (about 50 µm, for example) that is easy to break (for example, silicon or glass) and is, as a unit, a member without sufficient strength. On a bottom face of the first substrate 20 is formed individual pressure chambers (not shown) which are partitioned for the respective nozzle holes 11, which individual pressure chambers (not shown) communicate with individual ink supply ports 21.

Moreover, on the first substrate 20 are mounted a driver IC 22, and are formed multiple electromechanical transducer elements 23 and a connecting terminal 24. A drive voltage output of the driver IC 22 is electrically connected to the respective electromechanical transducer elements 23. The driver IC 22 includes a function of selecting the electromechanical transducer element 23 to be driven in accordance with print data sent from a host control apparatus (not shown). From a driving power supply input terminal, a power supply terminal, and input and output terminals of the driver IC 22, etc., a wiring which electrically connects these respective terminals and the connecting terminal 24 is put around.

The electromechanical transducer elements 23, which are elements for transducing an electrical signal to a mechanical displacement or for transducing the mechanical displacement to the electrical signal, is configured of a thin piezoelectric material, a resistive element, etc., which are difficult to wire three-dimensionally. The electromechanical transducer elements 23 may be formed in the first substrate 20 by a method such as printing, applying, film forming, pasting, etc. The respective electromechanical transducer elements 23 are provided in correspondence with the respective individual pressure chambers (not shown) and are mounted at positions which overlap the respective individual pressure chambers (not shown) in planar view, for example.

The reinforcing member 30 is a plate-shaped member which is mounted on the first substrate 20. The reinforcing member 30 is configured to reinforce the general whole area of the first substrate 20. Here, while the general whole area is not limited to a specific form as long as it has an area and an arrangement which allow holding with the reinforcing member 30 up to such a degree that the first substrate 20 becomes difficult to break in a cutting process, an assembly process, handling, etc., the reinforcing member 30 may be mounted such as to have a portion arranged in a region including an outer peripheral portion of the first substrate 20, for example. Moreover, the reinforcing member 30 may be mounted in a small (less than or equal to 10 µm, for example) region of a convex portion on the first substrate 20, on which convex portion components such as the driver IC 22, etc., are not mounted. In this way, the region which includes the outer peripheral portion of the first substrate 20 may be reinforced, making it possible to improve the strength of the first substrate 20.

It is preferable to be able to further improve an advantageous effect of preventing breakage when the reinforcing member 30 is mounted in a region which includes an outer peripheral end portion of the first substrate 20. Moreover, it is more preferable to be able to further improve an advantageous effect of preventing breakage when the reinforcing member 30 is mounted in a region which includes all outer peripheral end portions (all fours sides when the first substrate 20 has a rectangular shape). Furthermore, it is still more preferable to be able to further improve an advantageous effect of preventing breakage when the reinforcing member 30 is mounted in all regions on the first substrate 20 except the region in which components such as the driver IC 22, a metal wire 61, etc., are arranged.

In the reinforcing material 30 is formed a common ink channel 31 which guides ink to the individual ink supply ports 21. As a material of the reinforcing member 30 may be used stainless steel, silicon with a thickness of at least a few hundred µm, resin, etc., for example.

A frame member 40 is a member which is joined with a laminated body of the reinforcing member 30; the first substrate 20; and the nozzle substrate 10. In the frame member 40 is formed an ink supply port 41 which supplies ink to the common ink channel 31 from an ink tank (not shown). The frame member 40 is joined with the laminated body of the reinforcing member 30, the first substrate 20, and the nozzle substrate 10 to form an ink channel from the ink supply port 41 to the nozzle hole 11.

The second substrate 50 is a flexible substrate such as an FPC, an FFC, etc., for example. In the second substrate 50 multiple wires (not shown) are formed, and the one end side of the respective wires is electrically connected to the connecting terminal 24 of the first substrate 20. The other end side of the respective wires of the second substrate 50 is electrically connected to a host control apparatus (not shown).

When drive power and print data are supplied to the driver IC 22 via the respective wires (not shown) of the first substrate 20 and the respective wires (not shown) of the second substrate 20, the driver IC 22 selects the electromechanical transducer element 23 in accordance with the print data and applies a drive voltage to the selected electromechanical transducer element 23. The electromechanical transducer element 23, which is driven in accordance with the drive voltage, produces a pressure change of a corresponding individual pressure chamber (not shown), causing liquid droplets (ink droplets) to be ejected from the corresponding nozzle hole 11.

Figure 2:
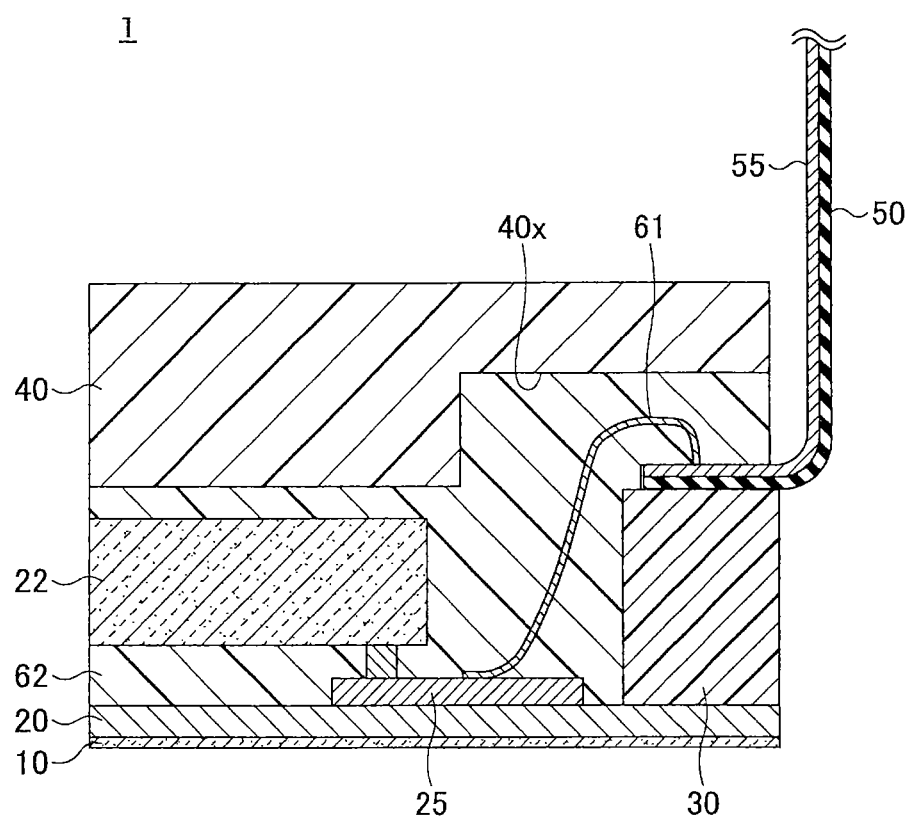
FIG. 2 is a cross-sectional view exemplifying a connecting portion of a second substrate in the liquid droplet ejecting head according to the first embodiment.
Figure 3:
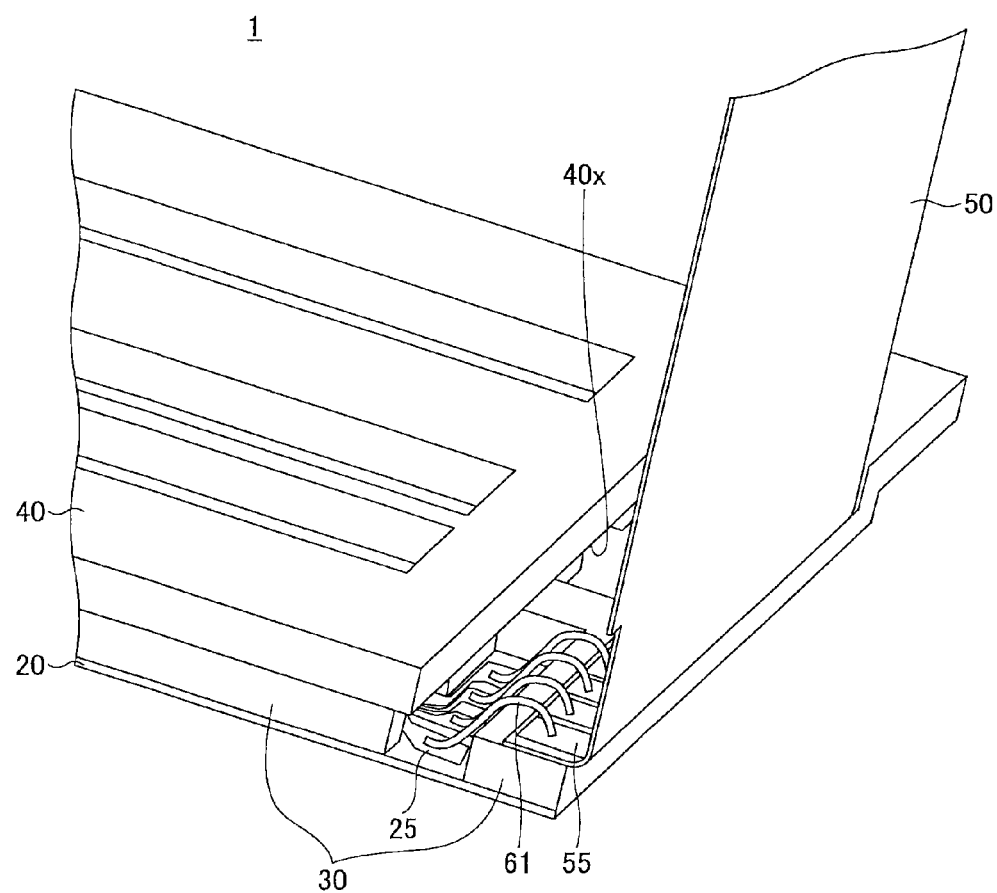
FIG. 3 is a partial perspective view exemplifying the connecting portion of the second substrate in the liquid droplet ejecting head according to the first embodiment.

Here, with reference to FIGS. 2 and 3, a more specific example of a connecting portion of the second substrate 50 is explained. FIG. 2 is a cross-sectional view exemplifying a connecting portion of a second substrate in the liquid droplet ejecting head according to the first embodiment, while FIG. 3 is a partial perspective view exemplifying the connecting portion of the second substrate in the liquid droplet ejecting head according to the first embodiment.

With reference to FIGS. 2 and 3, the first substrate 20 is provided with a first wiring member 25 and is electrically connected to the driver IC 22 which selects the electromechanical transducing element 23 (see FIG. 1) to be driven to supply driving power.

The reinforcing member 30 is mounted (fixed) on the first substrate 20 via an adhesive (not shown), for example. In the present embodiment, it is ensured that the reinforcing member 30 is not joined at a location at which the first wire 25 is arranged. This may make the first wiring member 25 thick, so that resistance of the first wiring member 25 becomes low, making it possible to suppress heat generation at the time of electric conduction. When the heat generation at the time of electric conduction is not problematic, the reinforcing member 30 may also be bonded to a location at which the first wiring member 25 is arranged (see the below-described fourth embodiment).

The second substrate 50, which is provided with a second wiring member 55, is mounted on (fixed onto) the reinforcing member 30 via an adhesive (not shown), for example, such that an exposed portion of the second wiring member 55 faces up.

Here, it is preferable that the second substrate 50 is fixed onto the reinforcing member 30 arranged at an end portion of the first substrate 20. Included in the reasons may be that, first, an area of the second wiring member 55 may be minimized. Also included in the reasons may be that, second, even when a tool used for fixing the second substrate 50 onto the reinforcing member 30 is relatively large, the tool may be used such that it is bulged out of the one end portion of the first substrate 20, so that an assembly task is simplified. The other end portion of the second substrate 50 is bulged out of the first substrate 20.

The first wiring member 25 and the second wiring member 55 are electrically connected via the metal wire 61 (wire). Driving power is supplied to the electromechanical transducer elements 23 via the second wiring member 55, the metal wire 61, the first wiring member 25, and the driver IC 22, causing the electromechanical transducer elements 23 to flexually vibrate, so that liquid droplets are ejected.

As the metal wire 61, a material such as gold (Au), aluminum (Al), copper (Cu), etc., may be used. The metal wire 61 may be connected to the first wiring member 25 and the second wiring member 55 using a method such as wire bonding, etc., using ultrasound, for example. A portion to which the metal wire 61, and the first wiring member 25 and the second wiring member 55 are connected, etc., is sealed by a sealing material 62. As the sealing material 62, epoxy resin, etc., may be used, for example. The metal wire 61 is one representative example of a conductive material according to the present invention.

Wire bonding is used to connect the metal wire 61, and the first wiring member 25 and the second wiring member 55, making it possible to make an electrical connection with heating from room temperature to less than or equal to 200° C. Therefore, the first wiring member 25 and the second wiring member 55 may be electrically connected without degrading the adhesive which adheres the first substrate 20 and the reinforcing member 30, the first substrate 20 and the nozzle substrate 10, etc. Moreover, even when a water-repellent film is applied on a lower surface of the nozzle substrate 10, the first wiring member 25 and the second wiring member 55 may be electrically connected without degrading the water-repellent film.

The frame member 40 is laminated on the reinforcing member 30, while a notched portion 40x is provided in a region opposing the metal wire 61 or the second substrate 50 of the frame member 40. In lieu of the notched portion 40x, a spot facing portion may be provided. A portion which is connected to the second substrate 50 of the metal wire 61 and a portion which is mounted to the reinforcing member 30 of the second substrate 50 is accommodated in a space formed by the notched portion 40x or the spot facing portion.

Figure 4:
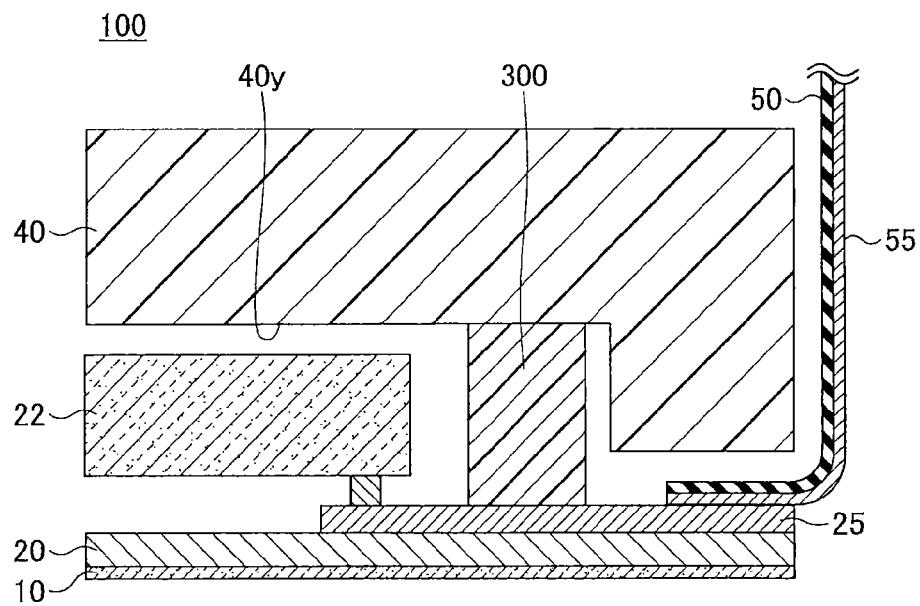
FIG. 4 is a cross-sectional view exemplifying the liquid droplet ejecting head according to a comparative example.

Here, advantageous effects of the first embodiment are explained with reference to a comparative example. FIG. 4 is a cross-sectional view exemplifying a liquid droplet ejecting head according to the comparative example. With reference to FIG. 4, the liquid droplet ejecting head 100 is different from the liquid droplet ejecting head 1 (see FIGS. 1 to 3) in that the second substrate 50 is directly pasted to the first substrate 20 and that the reinforcing member 30 is replaced by a reinforcing member 300.

As shown in FIG. 4, in a method in which the second substrate 50 is directly pasted to the first substrate 20, a reinforcing member 300 which reinforces a strength of the first substrate 20 is necessary. For example, when the second substrate 50 such as an FPC, etc., is directly pasted to the first substrate 20 to electrically connect the first wiring member 25 and the second wiring member 55, a step occurs between an upper face of the first substrate 20 and an upper face of the second substrate 20, so that it is difficult to join and fix the reinforcing member 300 from over the second substrate 50. Therefore, there is a problem that it is necessary to provide a large opening in the reinforcing member 300 as a space for connecting the second wiring member 55 and an opening space which is separate from the reinforcing member 300 becomes necessary, causing the size of the first substrate 20 to increase to raise the cost.

Moreover, while it is desirable to connect the second substrate 50 such as the FPC, etc., to an end portion of the first substrate 20 from points of view of construction method and wiring design, as shown in FIG. 4 the reinforcing member 300 is arranged in avoidance of a connecting portion of the first substrate 20 and the second substrate 50, causing the reinforcing member 300 to not be present at the end portion of the first substrate 20, so there is a problem that a strength of the connecting portion of the first substrate 20 and the second substrate 50 decreases.

Moreover, unlike FIG. 4, in a method in which the first wiring member 25 and the second wiring member 55 are joined by soldering, heating is conducted to at least around 200° C., so there is a problem of causing an adhesive which adheres the first substrate 20 and the reinforcing member 300 to degrade and causing a water-repellent film which is applied onto a lower surface of the nozzle substrate laminated on a lower face of the first substrate 20 to degrade.

Moreover, in a method of joining the first wiring member 25 and the second wiring member 55 by wire bonding, while joining at as low a temperature is possible relative to a method of joining by soldering, it is not possible to overcome the problem in which the strength of the connecting portion of the first substrate 20 and the second substrate 50 is reduced.

In this way, while various problems as described above arise with a structure of the liquid droplet ejecting head 100 according to a comparative example, the liquid droplet ejecting head 1 according to the first embodiment solves these problems to demonstrate the below-described advantageous effects.

In other words, in the liquid droplet ejecting head 1 according to the first embodiment, the second substrate 50 is fixed onto the reinforcing member 30 to connect the fixed second substrate 50 to the first substrate 20 via the metal wire 61. Therefore, while reinforcing the first substrate 20 whose strength is insufficient, wiring (the metal wire 61) which supplies a signal from a host apparatus may be provided to the first substrate 20 in a small space. As a result, decreased size and cost and an increased reliability of the first substrate 20 may be realized.

Moreover, there is the reinforcing member 30 present at the end portion of the first substrate 20, making it possible to improve the strength of the connecting portion of the first substrate 20 and the second substrate 50. Furthermore, wiring bonding may be used for connecting the first wiring member 25 and the second wiring member 55 with the metal wire 61 to connect wiring without causing the water-repellent film or the adhesive to degrade due to high temperature.

Moreover, the reinforcing member 30 is not joined at a location at which the first wiring 25 is arranged, making it possible to thicken the first wiring 25 (for example, at least 2 μm may be secured with aluminum wiring). Therefore, the first wiring 25 becomes low resistance, making it possible to suppress heat generation at the time of electric conduction. In practice, few hundreds of the electromechanical transducer elements 23 may be electrically connected with the drive IC 22 on the first substrate 20. When the few hundreds of the electromechanical transducer elements 23 are driven simultaneously, around a few amperes of current may flow in the first wiring member 25 which supplies driving power for the electromechanical transducer elements 23 to the drive IC 22. The same advantageous effects are demonstrated even for a configuration in which the drive IC 22 is not mounted to the first substrate 20 and the first wiring member 25 is wired directly to the electromechanical transducer elements 23.

Moreover, the notched portion 40x or the spot facing portion is provided in a region facing the metal wire 61 or the second substrate 50 of the frame member 40, so that the metal wire 61 which is electrically connected between the first wiring member 25 and the second wiring member 55 is accommodated in the notched portion 40x or the spot facing portion. This makes it possible to avoid crushing the metal wire 61 to shorten the crushed metal wire when the frame member 40 is laminated and joined with the reinforcing member 30.

Second Embodiment

A second embodiment shows an example in which a spot facing portion is provided in the reinforcing member and the second substrate 50 or the metal wire 61 is accommodated in the spot facing portion of the reinforcing member. In the second embodiment, explanations of the same components as the already-described embodiment will be omitted.

Figure 5:
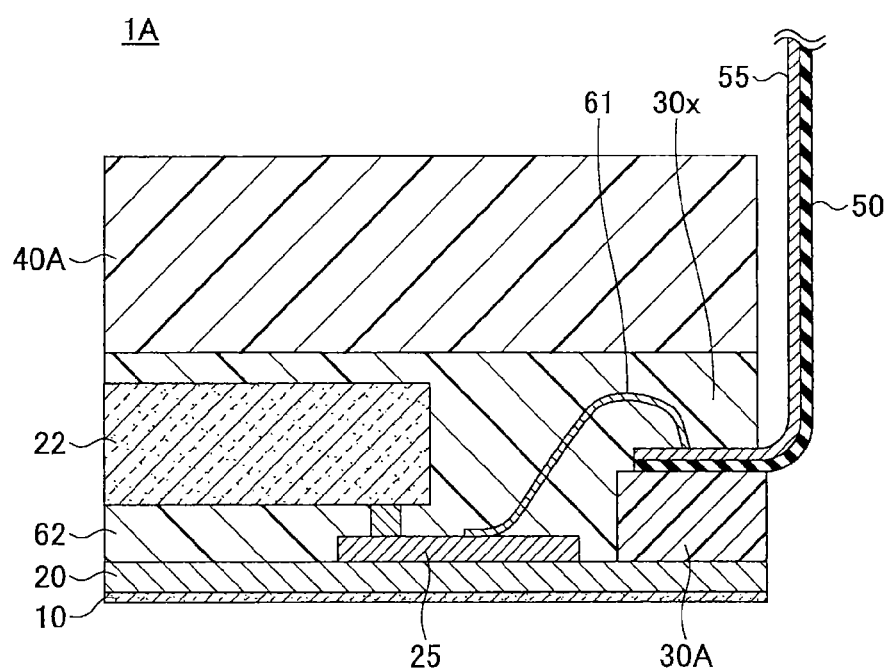
FIG. 5 is a cross-sectional view exemplifying the connecting portion of the second substrate in the liquid droplet ejecting head according to a second embodiment.
Figure 6:
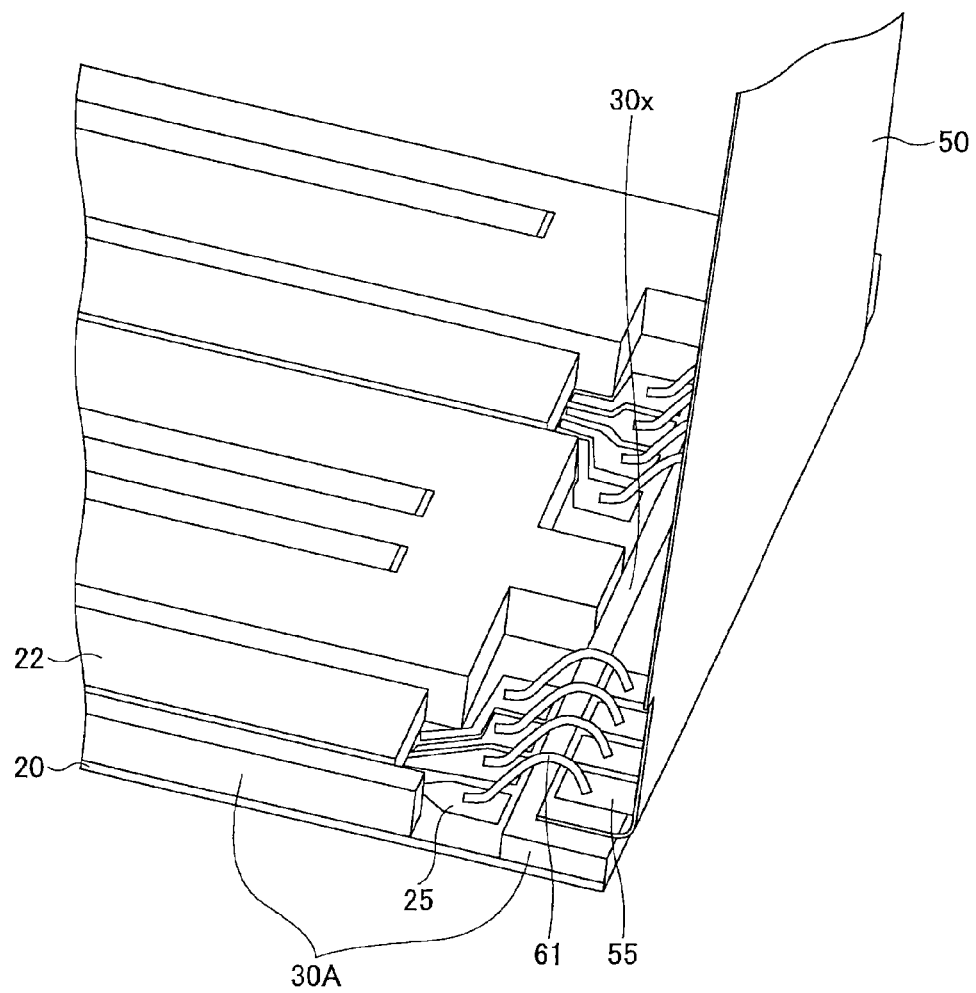
FIG. 6 is a partial perspective view exemplifying the connecting portion of the second substrate in the liquid droplet ejecting head according to the second embodiment.

FIG. 5 is a cross-sectional view exemplifying a connecting portion of a second substrate in the liquid droplet ejecting head according to the second embodiment, while FIG. 6 is a partial perspective view exemplifying the connecting portion of the second substrate in the liquid droplet ejecting head according to the second embodiment. With reference to FIGS. 5 and 6, the liquid droplet ejecting head 1A according to the second embodiment differs from the liquid droplet ejecting head 1 (see FIGS. 1 to 3) according to the first embodiment in that the reinforcing member 30 is replaced by a reinforcing member 30A and the frame member 40 is replaced by a frame member 40A.

A spot facing portion 30x is provided in a portion in which is arranged the metal wire 61 and a portion which is joined with the second substrate 50 of the reinforcing member 30A. In other words, a portion to which is mounted a second substrate 50 of the reinforcing member 30A has a height lower than that of a portion to which the second substrate 50 is not mounted. For example, the spot facing portion 30x may be formed by machining or half etching a face on the frame member 40A of the reinforcing member 30A.

In the frame member 40A, the notched portion 40x or the spot facing portion 30x is not provided as in the frame member 40. For example, a face on the reinforcing member 30A side of the frame member 40A may be made to be a flat face. The spot facing portion 30x is provided in the reinforcing member 30A even when the notched portion 40x or the spot facing portion is not provided in the frame member 40A, making it possible to secure a space which accommodates the metal wire 61 or the second substrate 50.

In other words, a portion to which is mounted the second substrate 50 of the reinforcing member 30A has a height which is lower than that of a portion to which is not mounted the second substrate 50, so that the second substrate 50 or the metal wire 61 is accommodated in a portion in which a height of the reinforcing member 30A is short. This makes it possible to avoid crushing the metal wire 61 to electrically shorten the crushed metal wire when the frame member 40A is laminated and joined with the reinforcing member 30A.

Third Embodiment

In a third embodiment is shown an example of using a conductive paste in lieu of the metal wire 61. In the third embodiment, explanations of the same components as the already-described embodiments will be omitted.

Figure 7:
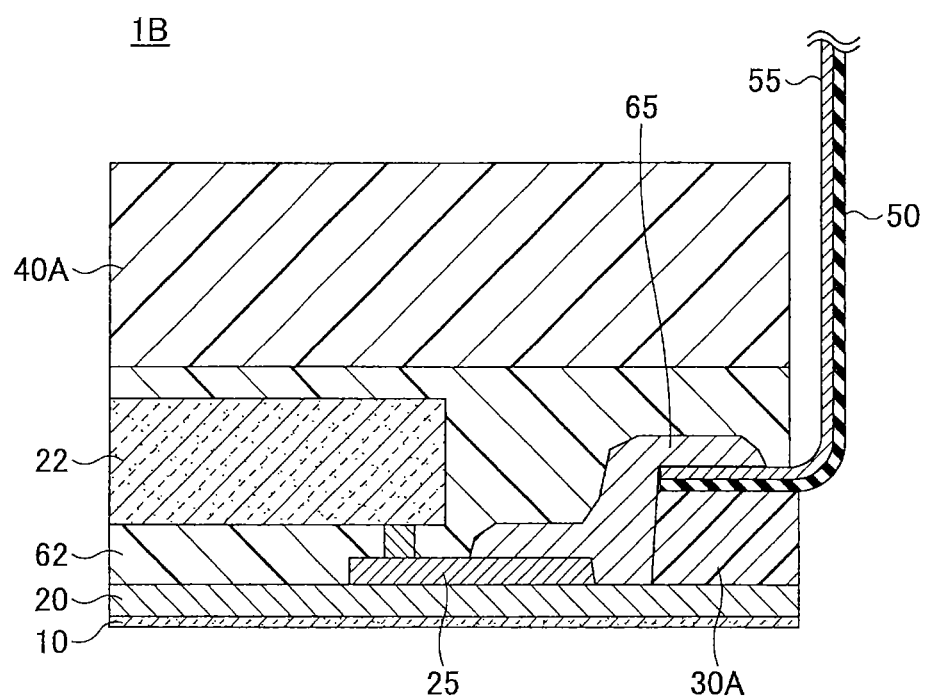
FIG. 7 is a cross-sectional view exemplifying the connecting portion of the second substrate in the liquid droplet ejecting head according to a third embodiment.

FIG. 7 is a cross-sectional view exemplifying the connecting portion of the second substrate in the liquid droplet ejecting head according to the third embodiment. With reference to FIG. 7, a liquid droplet ejecting head 1B according to the third embodiment differs from the liquid droplet ejecting head 1A (see FIGS. 5 and 6) in that the metal wire 61 is replaced by a conductive paste 65.

As shown in FIG. 7, the first wiring member 25 and the second wiring member 55 may be electrically connected via the conductive paste 65. The conductive paste 65 is a paste-shaped material in which a conductive material such as silver (Ag), gold (Au), copper (Cu), carbon (C), etc., is spread. For example, the conductive paste 65 may be formed at a predetermined position by a method such as printing, inkjet printing, applying, etc. The conductive paste 65 is one representative example of a conductive material according to the present invention.

The conductive paste 65 is used to suppress a height of a connecting portion between the second substrate 50 and the reinforcing member 30A relative to a case of using the metal wire 61. Moreover, it is also advantageous in that processing is simplified or processing time is shortened.

Furthermore, the first wiring member 25 and the second wiring member 55 may be electrically connected without degrading the adhesive which adheres the first substrate 20 and the reinforcing member 30A, the first substrate 20 and the nozzle substrate 10, etc., if a material from which low resistance may be obtained in low-temperature cure is selected as the conductive paste 65. Moreover, even when a water-repellent film is applied on a lower surface of the nozzle substrate 10, the first wiring member 25 and the second wiring member 55 may be electrically connected without degrading the water-repellent film.

Fourth Embodiment

In a fourth embodiment is shown an example of joining a reinforcing member to a location at which the first wire is arranged. In the fourth embodiment, explanations of the same components as the already-described embodiments will be omitted.

Figure 8:
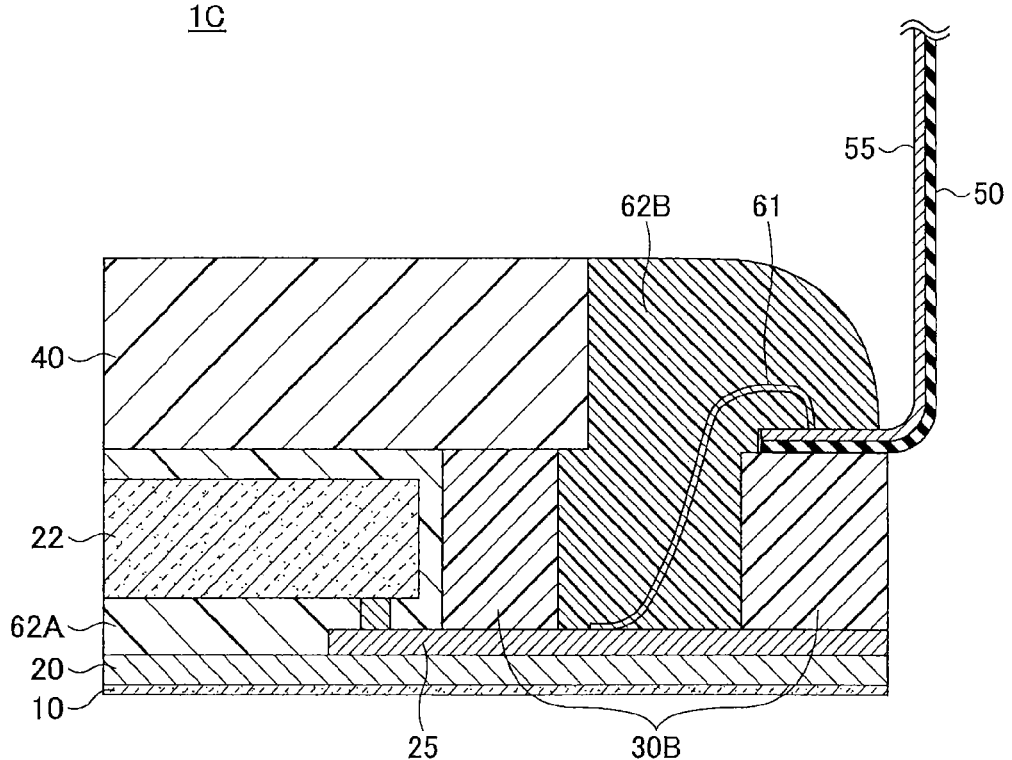
FIG. 8 is a cross-sectional view exemplifying the connecting portion of the second substrate in the liquid droplet ejecting head according to a fourth embodiment.

FIG. 8 is a cross-sectional view exemplifying the connecting portion of the second substrate in the liquid droplet ejecting head according to the fourth embodiment. With reference to FIG. 8, a liquid droplet ejecting head 1C according to the fourth embodiment differs from the liquid droplet ejecting head 1 according to the first embodiment (see FIGS. 1-3) in that the reinforcing member 30 is replaced by the reinforcing member 30B and a sealing material 62 is replaced by sealing materials 62A and 62B.

As shown in FIG. 8, a reinforcing member 30B is arranged on a first wiring member 25. In a similar manner to the reinforcing member 30 or the reinforcing member 30A, the reinforcing member 30B is configured to reinforce generally the whole area of the first substrate 20. The frame member 40, which is laminated on the reinforcing member 30, is configured such that the vicinity of a region in which the first wiring member 25 and the second wiring member 55 are electrically connected via the metal wire 61 (wire) is exposed.

The vicinity of a region on the first substrate 20 in which the driver IC 22 is mounted is sealed by a sealing material 62A. Moreover, a portion to which the metal wire 61, and the first wiring member 25 and the second wiring member 55 are connected, etc., is sealed by a sealing material 62B. As the sealing materials 62A and 62B, epoxy resin, etc., may be used, for example.

In this way, a reinforcing member may be joined to a location at which the first wiring is arranged. In this case, while it becomes difficult to thicken the first wire compared to the first to third embodiments, the advantageous effects below which cannot be obtained from the first to third embodiments are obtained. In other words, it becomes possible to perform steps of forming the sealing material 62A and of forming the sealing material 62B in a divided manner, making it possible to improve a degree of freedom of design of a manufacturing process. Moreover, it becomes possible to appropriately select whether to use the same material or different materials for the sealing materials 62A and 62B.

Fifth Embodiment

In a fifth embodiment, an example of an image forming apparatus to which is mounted a liquid droplet ejecting head 1 is shown. In the fifth embodiment, explanations of the same components as the already-described embodiments will be omitted.

Figure 9:
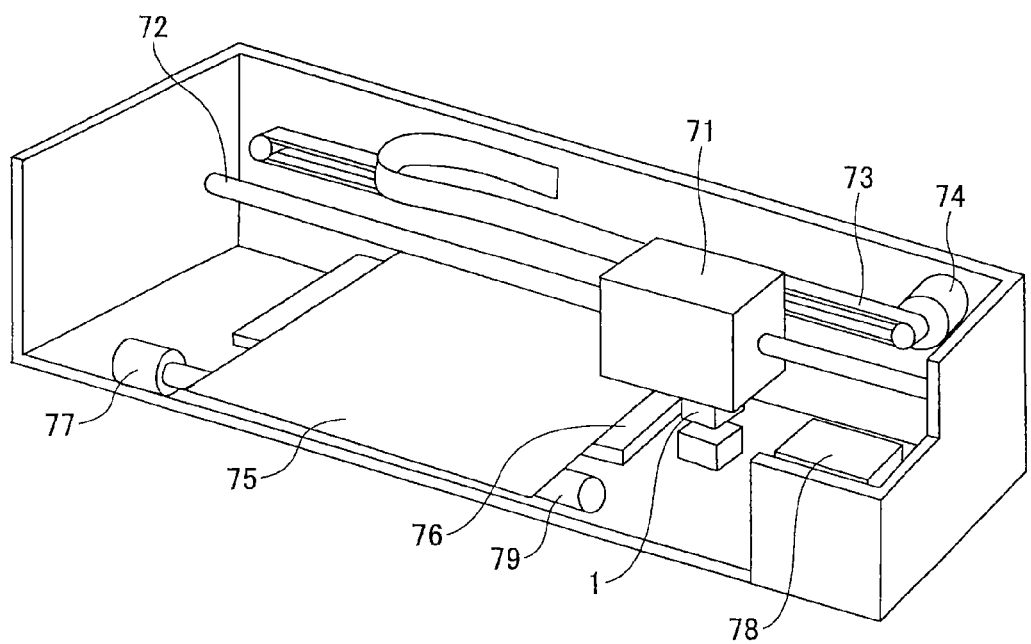
FIG. 9 is a perspective view exemplifying an image forming apparatus according to a fifth embodiment.
Figure 9:
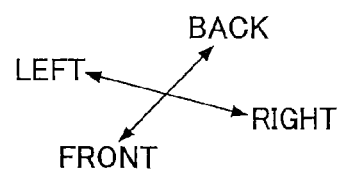

FIG. 9 is a perspective diagram exemplifying an image forming apparatus according to the fifth embodiment. With reference to FIG. 9, an image forming apparatus 2 according to the fifth embodiment has mounted thereto a liquid droplet ejecting head 1 (see FIGS. 1 to 3).

A carriage 71, which is provided inside the image forming apparatus 2, is configured to be movable to the left and the right along a columnar support 72. The carriage 71 is connected to a belt 73, which is connected to a motor 74. The motor 74 rotates to cause the belt 73 to move to the left and the right and to simultaneously cause the carriage 71 to move to the left and the right.

In the carriage 71 is provided a liquid droplet ejecting head 1 in which are provided a large number of nozzles (not shown) over multiple columns. The liquid droplet ejecting head 1 moves to the left and the right together with movement of the carriage 71. Moreover, a paper-feeding roller 79 and a platen 76 which support the media 75 are provided in the image forming apparatus 2. The paper-feeding roller 79 is moved by the motor 77 while supporting the media 75 with the platen 76 to convey the media 75 forward.

For example, liquid droplets are ejected to the media 75 from the liquid droplet ejecting head 1 in accordance with image data sent from a control apparatus (not shown) while moving the carriage 71 to the left. Then, for example, the media 75 is next moved forward by a predetermined distance, liquid droplets are ejected to the media 75 from the liquid droplet ejecting head 1 in accordance with the image data sent from the control apparatus (not shown) while moving the carriage 71 to the right after moving the media 75 forward by a desired distance. These operations may be repeated to obtain a desired image on one face on the media 75.

The carriage 71 waits on a maintenance apparatus 78 when not performing imaging; here, it is made possible to absorb ink from the liquid droplet ejecting head 1 and recover a nozzle which no longer ejects and to cap the liquid droplet ejecting head 1 to seal the nozzle and prevent ink from drying so as to be not ejected.

In this way, the liquid droplet ejecting head 1 may be mounted to realize an image forming apparatus 2 with a high reliability and low cost. The liquid droplet ejecting head 1A and the liquid droplet ejecting head 1B may be mounted in lieu of the liquid droplet ejecting head 1.

While preferred embodiments have been described in the above in detail, they are not limited to the above-described embodiments, so that various changes and modifications may be added to the above-described embodiments and examples without departing from a scope recited in the claims.

For example, a conductive paste 65 may be used in lieu of the metal film 61 in the liquid droplet ejecting head 1.

The present application is based on and claims the benefit of priority of Japanese Priority Application No. 2012-162023 filed on Jul. 20, 2012, the entire contents of which are hereby incorporated by reference.

The invention claimed is:

1. A liquid droplet ejecting head, comprising:
an electromechanical transducer element;
a first substrate which includes a first wiring member;
a reinforcing member which is mounted on the first substrate; and
a second substrate which includes a second wiring member and which is mounted on the reinforcing member, wherein
liquid droplets are ejected when driving power is supplied to the electromechanical transducer element via the first wiring member and the second wiring member.

2. The liquid droplet ejecting head as claimed in claim 1, wherein the reinforcing member is mounted in a region which includes one or more outer peripheral end portions of the first substrate.

3. The liquid droplet ejecting head as claimed in claim 2, wherein the reinforcing member is mounted in a region which includes all of the peripheral end portions of the first substrate.

4. The liquid droplet ejecting head as claimed in claim 1, wherein one end portion of the second substrate is fixed on the reinforcing member which is located on an outer peripheral portion of the first substrate, and wherein the other end portion of the second substrate protrudes from the first substrate.

5. The liquid droplet ejecting head as claimed in claim 1, wherein the reinforcing member is mounted in a region in which the first wiring on the first substrate is not arranged.

6. The liquid droplet ejecting head as claimed in claim 1, wherein the reinforcing member is mounted in a region in which the first wiring on the first substrate is arranged.

7. The liquid droplet ejecting head as claimed in claim 1, further comprising a conductive material which electrically connects the first wiring member and the second wiring member, wherein the conductive material is a metal wire.

8. The liquid droplet ejecting head as claimed in claim 1, further comprising a conductive material which electrically connects the first wiring member and the second wiring member, wherein the conductive material is a conductive paste.

9. The liquid droplet ejecting head as claimed in claim 1, further comprising a frame member which is laminated on the reinforcing member, wherein
a notched portion or a spot facing portion is provided on the reinforcing member side of the frame member, and wherein
a portion which is mounted to the reinforcing member of the second substrate is accommodated in a space formed by the notched portion or the spot facing portion.

10. The liquid droplet ejecting head as claimed in claim 1, wherein a portion in which is mounted the second substrate of the reinforcing member has a height which is lower than that of a portion in which is not mounted the second substrate.

11. The liquid droplet ejecting head as claimed in claim 1, further comprising:
multiple nozzle holes which eject the liquid droplets; and
individual pressure chambers which communicate to the nozzle holes and which are partitioned for each of the nozzle holes, wherein the electromechanical transducer element is provided in a multiple number in correspondence with the respective individual pressure chambers.

12. An image forming apparatus which has mounted thereto the liquid droplet ejecting head as claimed in claim 1.

* * * * *